(12) United States Patent
Takeuchi

(10) Patent No.: US 7,508,729 B2
(45) Date of Patent: Mar. 24, 2009

(54) OSCILLATOR CIRCUIT GENERATING OSCILLATING SIGNAL HAVING STABLE CYCLE

(75) Inventor: Atsushi Takeuchi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 71 days.

(21) Appl. No.: 11/798,485

(22) Filed: May 14, 2007

(65) Prior Publication Data

US 2007/0268080 A1 Nov. 22, 2007

(30) Foreign Application Priority Data

May 17, 2006 (JP) ............................. 2006-138007

(51) Int. Cl.
*G11C 7/00* (2006.01)

(52) U.S. Cl. ..................... 365/222; 365/149; 331/143

(58) Field of Classification Search ............... 365/222, 365/149, 189.07, 194, 189.09; 331/111, 331/143, 175, 47

See application file for complete search history.

(56) References Cited

U.S. PATENT DOCUMENTS

| | | | | |
|---|---|---|---|---|
| 4,827,503 | A | * | 5/1989 | Takato et al. ............ 379/373.01 |
| 5,032,972 | A | * | 7/1991 | Erckert ..................... 363/97 |
| 5,594,699 | A | | 1/1997 | Nomura et al. |
| 5,774,404 | A | | 6/1998 | Eto |
| 5,867,438 | A | | 2/1999 | Nomura et al. |
| 5,870,345 | A | | 2/1999 | Stecker |
| 6,075,739 | A | | 6/2000 | Ihara |
| 6,097,658 | A | | 8/2000 | Satoh et al. |
| 6,680,656 | B2 | | 1/2004 | Chen |

FOREIGN PATENT DOCUMENTS

| | | |
|---|---|---|
| EP | 0735677 A1 | 10/1996 |
| EP | 1530293 A2 | 5/2005 |
| FR | 2816131 A | 5/2002 |
| JP | 07-220473 | 8/1995 |
| JP | 08-171795 | 7/1996 |
| JP | 08-279733 | 10/1996 |
| JP | 10-289573 | 10/1998 |
| JP | 11-168358 | 6/1999 |

* cited by examiner

*Primary Examiner*—Dang T Nguyen
(74) *Attorney, Agent, or Firm*—Arent Fox LLP

(57) ABSTRACT

An oscillator circuit includes a capacitor, a first constant current source electrically couplable to an end of the capacitor, a second constant current source electrically couplable to the end of the capacitor, a control circuit coupled to the end of the capacitor, a first reference potential, and a second reference potential to switch, in response to a comparison of a potential at the end of the capacitor with the first and second reference potentials, between a first operation to charge the capacitor by electrically coupling the first constant current source to the end of the capacitor and a second operation to discharge the capacitor by electrically coupling the second constant current source to the end of the capacitor, and a circuit configured to have an output signal thereof exhibiting a signal transition in response to timing at which the switching occurs between the first operation and the second operation.

10 Claims, 12 Drawing Sheets

FIG.11

| startz | readyz | sroscz | a1 | a2 | a3 | a4 | a5 | DESCRIPTION |
|---|---|---|---|---|---|---|---|---|
| H | * | H | H | L | L | L | L | vosc Up |
| H | * | L | L | H | H | L | L | vosc Down |
| L | H | * | H | L | L | H | L | Feed-Back |
| L | L | H | L | H | L | L | H | Stop |

36

OSCILLATOR CIRCUIT GENERATING OSCILLATING SIGNAL HAVING STABLE CYCLE

CROSS-REFERENCE TO RELATED APPLICATIONS

The present application is based upon and claims the benefit of priority from the prior Japanese Patent Application No. 2006-138007 filed on May 17, 2006, with the Japanese Patent Office, the entire contents of which are incorporated herein by reference.

BACKGROUND OF THE INVENTION

1. Field of the Invention

The present invention generally relates to oscillator circuits, and particularly relates to an oscillator circuit which generates a signal having a cycle responsive to the charge/discharge operation of a capacitor.

2. Description of the Related Art

In DRAMs using memory capacitors to store data, there is a need to perform a restore operation (i.e., refresh operation) to retain information stored in the cells. Such restore operation includes reading cell data by successively activating word selecting lines, amplifying the data voltage by use of sense amplifiers, and restoring the amplified data to the cells. Refresh operations are periodically performed at predetermined refresh intervals with respect to the memory array or block that is subjected to a refresh operation. An electric current consumed by a refresh operation may be represented as follows.

$$I_{REF} = q_{REF} \cdot N_{REF} / t_{REF}$$

Here, $q_{REF}$ represents the amount of electric charge that is consumed by a single refresh operation (i.e., a refresh operation for one activation of one word line), $N_{REF}$ representing the number of refresh operations (i.e., the number of refresh operations each corresponding to one activation of one word line) performed in one cycle (i.e., in one refresh cycle), and $t_{REF}$ representing a refresh cycle.

In order to reduce the consumed current $I_{REF}$, it is desirable to prolong the refresh cycle tREF as much as possible within the time period during which the data of DRAM cells can be retained. Since the refresh cycle $t_{REF}$ exhibits variation from circuit to circuit, however, the refresh cycle $t_{REF}$ should be determined so as to provide a margin that takes into account such a variation for the purpose of reliably ensuring that the refresh cycle $t_{REF}$ always stays shorter than the data retainable period. Accordingly, in order to reduce the consumed current $I_{REF}$ by prolonging the refresh cycle $t_{REF}$ as much as possible, there is a need to suppress the variation of the refresh cycle $t_{REF}$ so as to perform each refresh operation at precise cycles.

$q_{REF} \cdot N_{REF}$ becomes larger when the memory capacity is increased, resulting in an increase of an electric current necessary for refresh operations. There will also be an increase in the amount of change in the consumed current $I_{REF}$ responsive to the variation of the refresh cycle $t_{REF}$. In such a case, a change in the consumed current $I_{REF}$ responsive to the variation of the refresh cycle $t_{REF}$ cannot be disregarded. There is thus a need to set the refresh cycle $t_{REF}$ accurately in order to suppress an increase in current consumption as much as possible.

In the self-refresh mode of a DRAM, a refresh operation is performed at intervals responsive to a cycle of a signal generated by an oscillator inside the DRAM, rather than being performed in response to a refresh command supplied from an external source. FIG. 1 is a drawing showing an example of the configuration of such oscillator (Patent Document 1 through 4).

The oscillator circuit shown in FIG. 1 includes a comparator 11, a constant current source 12, a capacitor 13, a delay circuit 14, a PMOS transistor 15, an NMOS transistors 16, and a NAND gate 17. In the state in which no electric charge is accumulated in the capacitor 13 (capacitance C), a potential vosc at the charge store node of the capacitor 13 is lower than a reference voltage vref. Accordingly, the output of the comparator 11 having an inverted input thereof coupled to the charge store node of the capacitor 13 and a non-inverted input thereof coupled to the reference voltage vref is HIGH, resulting in an oscillator circuit output pulsex being HIGH. In this state, a startup signal startz is changed to HIGH. In response, the output of the NAND gate 17 is changed to LOW, thereby making the NMOS transistors 16 nonconductive. In response to this, an electric current equal in amount to a current amount Icmp of the constant current source 12 flows into the capacitor 13, thereby accumulating electric charge in the capacitor 13.

As the potential vosc of the charge store node of the capacitor 13 exceeds the reference voltage vref, the output of the comparator 11 changes from HIGH to LOW. Subsequently, the oscillator output pulsex changes from HIGH to LOW after the passage of a delay time introduced by the delay circuit 14. In response to this, the output of the NAND gate 17 becomes HIGH to make the NMOS transistors 16 conductive, so that the capacitor 13 is discharged to return to the original state in which no electric charge is accumulated. In response, the output of the comparator 11 returns to HIGH.

In the operation described above, further, the PMOS transistor 15 becomes conductive when the oscillator output pulsex changes from HIGH to LOW, thereby setting the output of the comparator 11 to HIGH. This makes sure than the oscillator output pulsex becomes a pulse signal that sustains its LOW state for a predetermined period corresponding to the delay time of the delay circuit 14 regardless of the response speed of the comparator 11.

The operation described above is repeated so that the oscillator circuit of FIG. 1 outputs pulses at constant time intervals. The cycle (interval) of this pulse is theoretically C·vref/Icmp.

The cycle generated by an oscillator as described above tend to exhibit variation due to variations in the current source, capacitance, reference voltage, comparator offsets, etc. There is thus a need to adjust the oscillating cycle of the oscillator to a desired cycle by measuring the oscillating cycle of the oscillator by use of a tester at a testing step of a circuit (e.g., DRAM) incorporating such oscillator (see Patent Document 5). Arrangement is made in advance such that an oscillating cycle is adjustable by adjusting the current amount of the current source through cutting or leaving intact fuses, for example. The fuses may then be cut as appropriate to achieve a desired cycle based on the checking of the cycle measured by the tester.

When the oscillator circuit shown in FIG. 1 is implemented as a semiconductor device, a MOS transistor is typically used as the capacitor 13. In this case, the capacitance between the gate node and source/drain nodes of the MOS transistor depends on a threshold voltage Vth of the MOS transistor.

FIG. 2 is a drawing showing the capacitance characteristics of a MOS transistor when the threshold voltage Vth of the MOS transistor exhibits variation. In FIG. 2, the horizontal axis represents a gate-source voltage Vgs, and the vertical axis represents a MOS capacitance Cgg. As shown in FIG. 2, when the voltage applied to the gate node (i.e., the gate-source voltage Vgs) is low, no channel is created so that the capacitance Cgg is relatively a small value. As the voltage Vgs become sufficiently large, a channel is created. In response, the capacitance Cgg becomes a relatively large value, which is responsive to the gate length and gate-film width.

In the oscillator circuit shown in FIG. 1, the voltage across the capacitor 13 has a voltage range from 0 V to more than vref. Namely, when the oscillator circuit is oscillating, the voltage Vgs varies in a range that includes a point at which the capacitance Cgg exhibits a large sudden change as shown in FIG. 2.

With a variation in the threshold voltage Vth of the MOS capacitor, the capacitance change relative to the change of the voltage Vgs as shown by the solid lines in FIG. 2 ends up also having a variation as illustrated by dotted lines. Namely, a capacitance characteristic 21 in which the large capacitance appears at a relatively low voltage Vgs is observed in the case of a relatively low threshold voltage Vth. Further, a capacitance characteristic 22 in which the large capacitance appears at a relatively high voltage Vgs is observed in the case of a relatively high threshold voltage Vth.

As a result, the amount of electric charge required for the potential vosc of the charge store node of the capacitor 13 to reach a certain potential ends up varying, so that the potential vosc of the charge store node of the capacitor 13 exhibits variation as shown in FIG. 3. In the case of the capacitance characteristic 21 shown in FIG. 2, the cycle becomes relatively long, resulting in a voltage waveform 23. In the case of the capacitance characteristic 22 shown in FIG. 2, the cycle becomes relatively short, resulting in a voltage waveform 24.

As previously described, the adjustment of the cycle in response to the tester measurements can suppress, to some degree, a cycle variation caused by variation in the threshold voltage Vth. Since the adjustable range is limited, the smaller the variation, the better the outcome will be. Further, the threshold voltage Vth not only varies depending on processes, but also varies depending on temperature. Thus, the cycle also varies depending on temperature. It would be necessary to provide a plurality of adjustment means and to measure temperature at a plurality of measurement points in order to adjust such a variation in the cycle caused by temperature changes. This adds up the test cost.

[Patent Document 1] Japanese Patent Application Publication No. 08-171795

[Patent Document 2] Japanese Patent Application Publication No. 11-168358

[Patent Document 3] Japanese Patent Application Publication No. 8-279733

[Patent Document 4] Japanese Patent Application Publication No. 10-289573

[Patent Document 5] Japanese Patent Application Publication No. 7-220473

Accordingly, there is a need for an oscillator circuit capable of generating an oscillating signal having a predetermined cycle that is not affected by variation in the capacitance characteristics caused by the variation of the threshold voltage Vth.

SUMMARY OF THE INVENTION

It is a general object of the present invention to provide an oscillator circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by an oscillator circuit particularly pointed out in the specification in such full, clear, concise, and exact terms as to enable a person having ordinary skill in the art to practice the invention.

To achieve these and other advantages in accordance with the purpose of the invention, the invention provides an oscillator circuit, which includes a capacitor, a first constant current source electrically couplable to an end of the capacitor, a second constant current source electrically couplable to the end of the capacitor, a control circuit coupled to the end of the capacitor, a first reference potential, and a second reference potential to switch, in response to a comparison of a potential at the end of the capacitor with the first and second reference potentials, between a first operation to charge the capacitor by electrically coupling the first constant current source to the end of the capacitor and a second operation to discharge the capacitor by electrically coupling the second constant current source to the end of the capacitor, and a circuit configured to have an output signal thereof exhibiting a signal transition in response to timing at which the switching occurs between the first operation and the second operation.

In an oscillator circuit according to at least one embodiment of the present invention, two current sources for charging/discharging a capacitor are provided, and the charging/discharging of the capacitor is controlled in response to a comparison of the voltage across the capacitor with first and second reference potentials. Provision is further made such that the voltage range in which the voltage across the opposite ends of the capacitor varies in response to the charging/discharging is positioned above the threshold voltage of the MOS capacitor. In other words, the voltage range in which the voltage across the capacitor varies in response to the charging/discharging operation is set such as not to include the threshold voltage of the MOS transistor. With this provision, it is possible to generate a cyclic signal that is not affected by the variation of the threshold voltage.

BRIEF DESCRIPTION OF THE DRAWINGS

Other objects and further features of the present invention will be apparent from the following detailed description when read in conjunction with the accompanying drawings, in which:

FIG. 11 is a truth table showing the inputs/outputs of a logic circuit;

DESCRIPTION OF THE PREFERRED EMBODIMENTS

In the following, embodiments of the present invention will be described with reference to the accompanying drawings.

Figure 4:
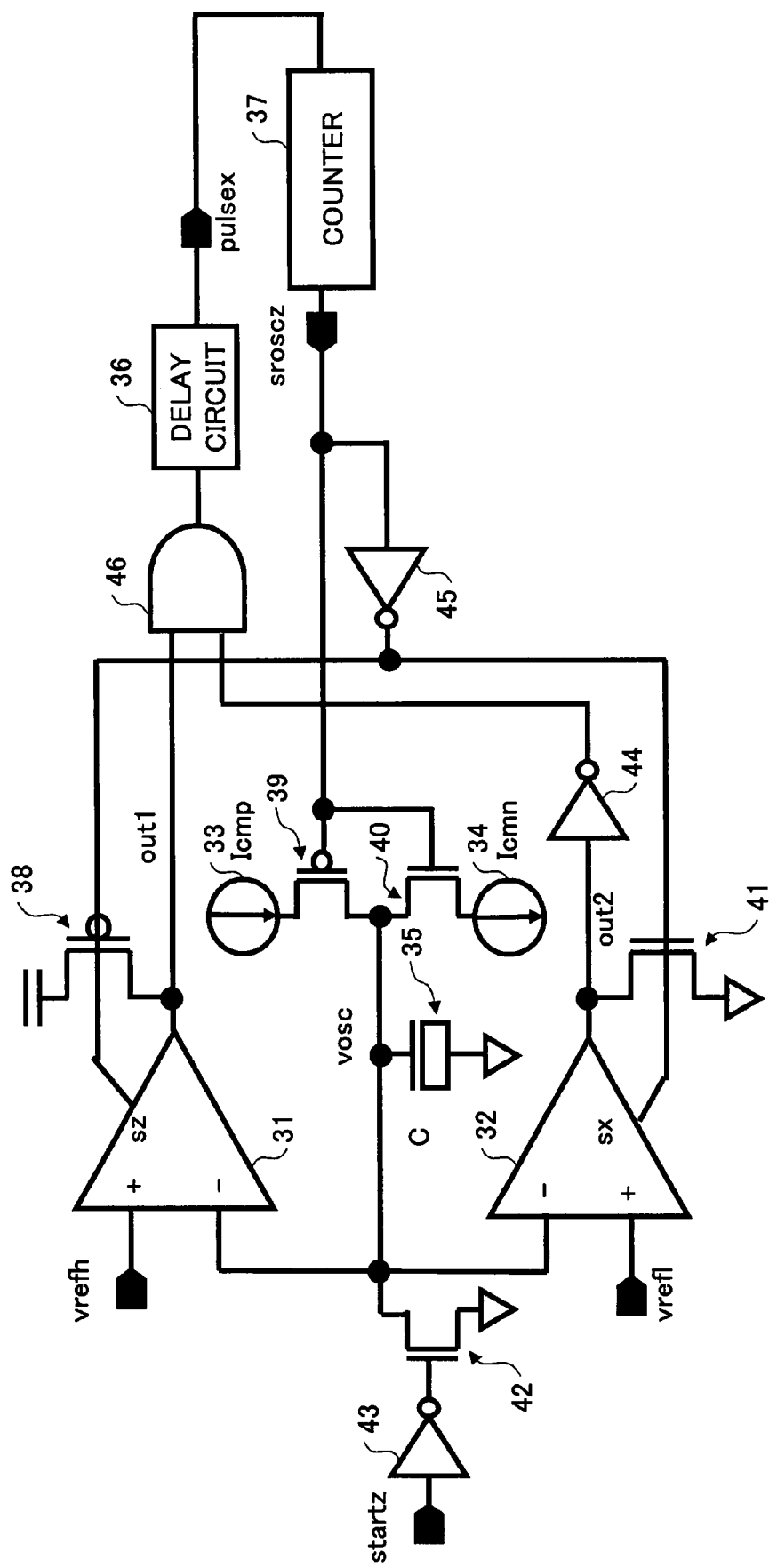
FIG. 4 is a drawing showing the circuit configuration of a first embodiment of an oscillator circuit according to the present invention.

FIG. 4 is a drawing showing the circuit configuration of a first embodiment of an oscillator circuit according to the present invention. This oscillator circuit may be used for the purpose of controlling the refresh operation of a semiconductor memory device, for example. An oscillator circuit 30 shown in FIG. 4 includes a comparator 31, a comparator 32, a constant current source 33, a constant current source 34, a capacitor 35, a delay circuit 36, a counter 37, PMOS transistors 38 and 39, NMOS transistors 40 through 42, inverters 43 through 45, and an AND gate 46.

A startup signal startz is first changed to HIGH. In response, the NMOS transistor 42 becomes nonconductive, thereby starting the charging of the capacitor 35 through the constant current source 33 (with a current amount Icmp) or the discharging of the capacitor 35 through the constant current source 34 (with a current amount Icmn). It is assumed that, in the initial state, a predetermined amount of electric charge is accumulated in the capacitor 35 (capacitance C), so that a potential vosc at the charge store node of the capacitor 35 is lower than a reference voltage vrefh and higher than a reference voltage vrefl. The opposite node of the capacitor 35 is coupled to a ground potential. In this state, an output out1 of the comparator 31 having an inverted input thereof coupled to the charge store node of the capacitor 35 and a non-inverted input thereof coupled to the reference voltage vrefh is HIGH. Further, an output out2 of the comparator 32 having an inverted input thereof coupled to the charge store node of the capacitor 35 and a non-inverted input thereof coupled to the reference voltage vrefl is LOW. At this time, the two inputs into the AND gate 46 are both HIGH, so that an oscillator circuit output pulsex is HIGH.

It is assumed that, in this state, an output sroscz of the counter 37 is HIGH. The PMOS transistor 39 and the NMOS transistor 40 are thus nonconductive and conductive, respectively, so that discharge occurs from the capacitor 35 to the constant current source 34. As the potential vosc of the charge store node drops below the reference voltage vrefl in response to a decrease in the electric charge of the capacitor 35, the output out2 of the comparator 32 changes from LOW to HIGH. As a result, the output of the AND gate 46 changes from HIGH to LOW, and, thereafter, the oscillator output pulsex changes from HIGH to LOW after the passage of a delay time introduced by the delay circuit 36.

In response, the output sroscz of the counter 37 is changed to LOW. The output of the inverter 45 then changes from LOW to HIGH, so that a transition occurs from a state in which the output out1 of the comparator 31 is clamped to HIGH to a state in which the output out2 of the comparator 32 is clamped to LOW. In response, the output of the AND gate 46 returns from LOW to HIGH. At this time, the output sroscz of the counter 37 exhibits no change and stays at LOW.

Since the output sroscz of the counter 37 is LOW, the PMOS transistor 39 and the NMOS transistor 40 become conductive and nonconductive, respectively, so that charge from the constant current source 33 to the capacitor 35 occurs. As the potential vosc of the charge store node rises above the reference voltage vrefh in response to an increase in the electric charge of the capacitor 35, the output out1 of the comparator 31 changes from HIGH to LOW. As a result, the output of the AND gate 46 changes from HIGH to LOW, and, thereafter, the oscillator output pulsex changes from HIGH to LOW after the passage of a delay time introduced by the delay circuit 36.

In response, the output sroscz of the counter 37 is changed to HIGH. The output of the inverter 45 then changes from HIGH to LOW, so that a transition occurs from a state in which the output out2 of the comparator 32 is clamped to LOW to a state in which the output out1 of the comparator 31 is clamped to HIGH. In response, the output of the AND gate 46 returns from LOW to HIGH. At this time, the output sroscz of the counter 37 exhibits no change and stays at HIGH.

The operation of the comparator 31 is suspended by setting an activation signal sz to LOW during when the output out1 of the comparator 31 is clamped to HIGH. The operation of the comparator 32 is suspended by setting a negative-logic activation signal sx to HIGH during when the output out2 of the comparator 32 is clamped to LOW.

Figure 5:
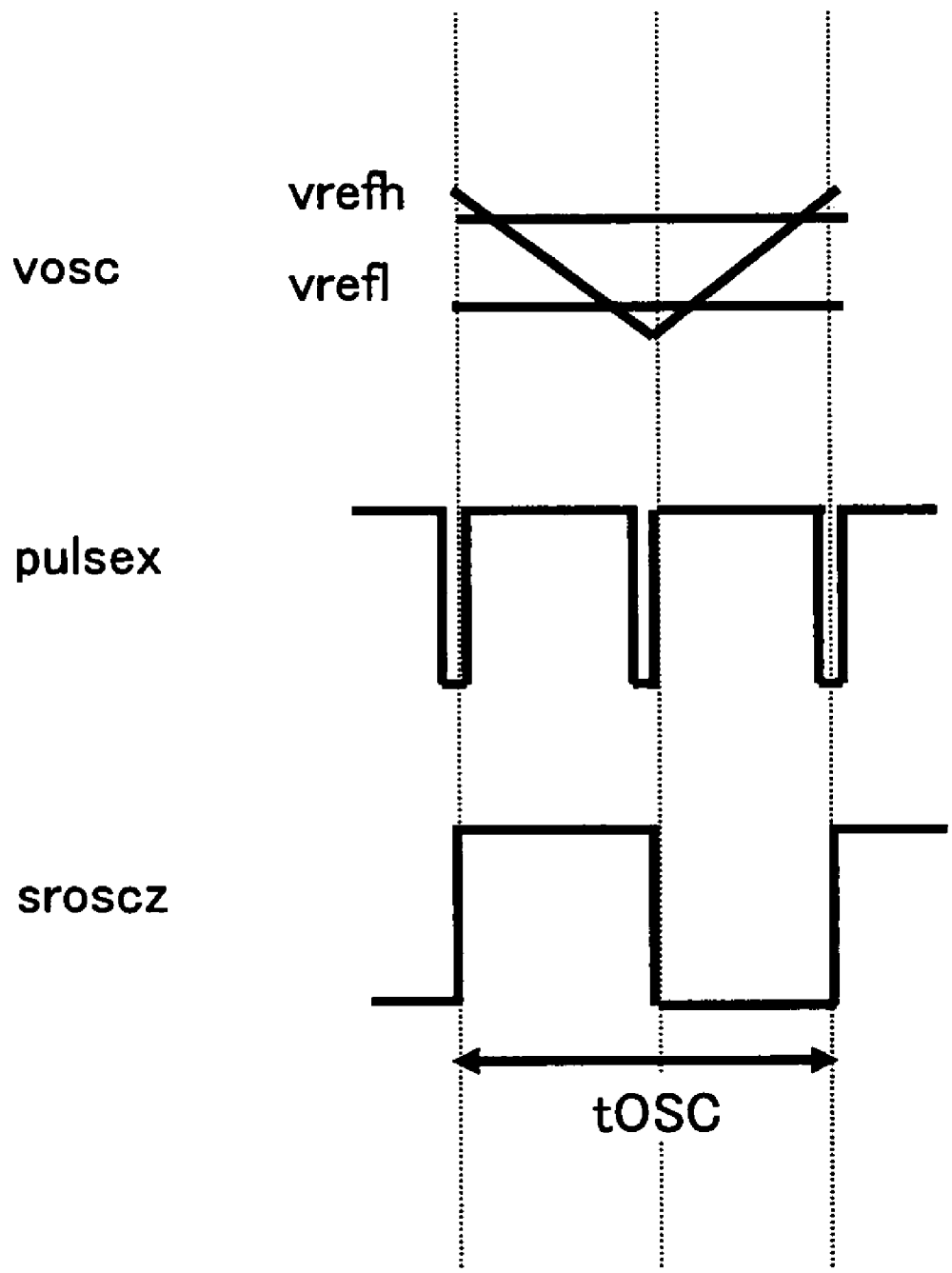
FIG. 5 is a drawing showing the signal waveforms of the potential of a charge store node, a pulse signal output, and the output of a counter.

The operation described above is repeated so that the potential vosc of the charge store node of the capacitor 35 repeatedly rises and falls between vrefl and vrefh, thereby generating a pulse signal output pulsex corresponding to such repeating operation. FIG. 5 is a drawing showing the signal waveforms of the potential vosc of the charge store node, the pulse signal output pulsex, and the output sroscz of the counter 37. As shown in FIG. 5, the potential vosc of the charge store node of the capacitor 35 falls during the HIGH period of the counter output sroscz, and rises during the LOW period of the counter output sroscz. The pulse signal output pulsex becomes LOW for a predetermined duration corresponding to the delay time of the delay circuit 36 at the timing at which the potential vosc switches between rising and falling. A cycle tOSC of this LOW pulse is theoretically $C \cdot (vrefh - vrefl) \cdot (1/Icmn + 1/Icmp)$.

Figure 1:
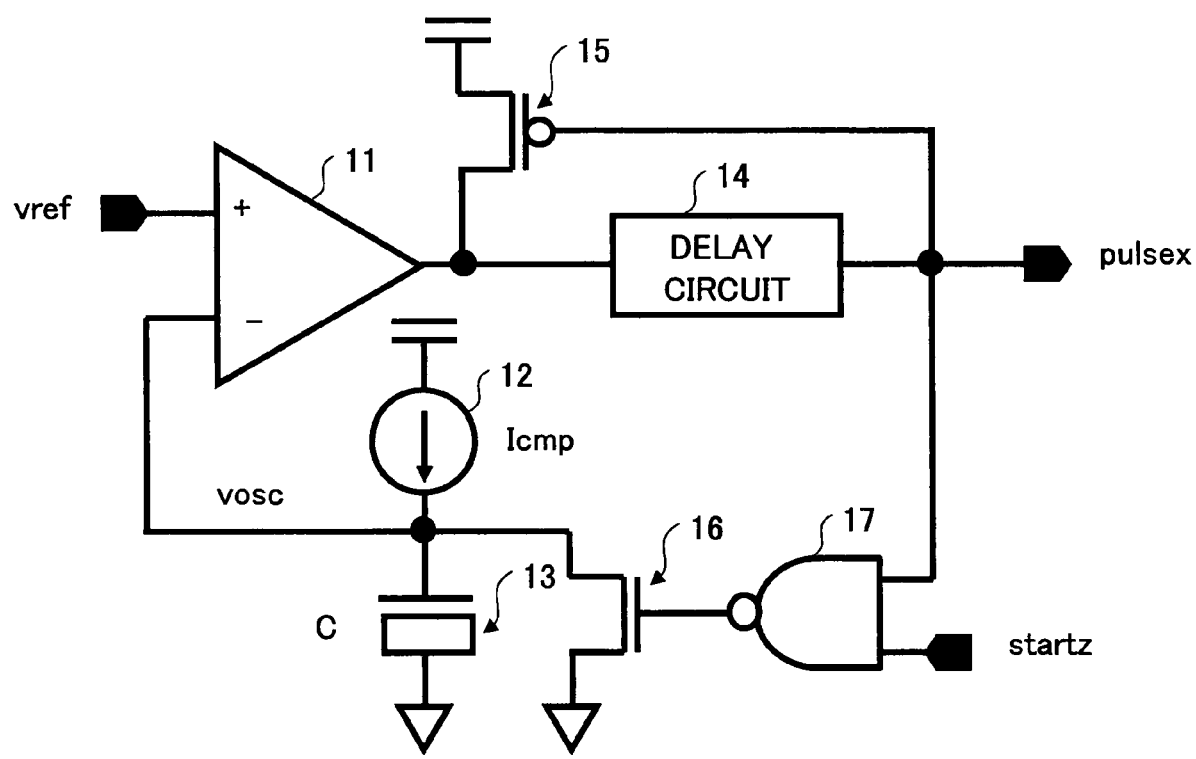
FIG. 1 is a drawing showing an example of the configuration of a related-art oscillator.
Figure 2:
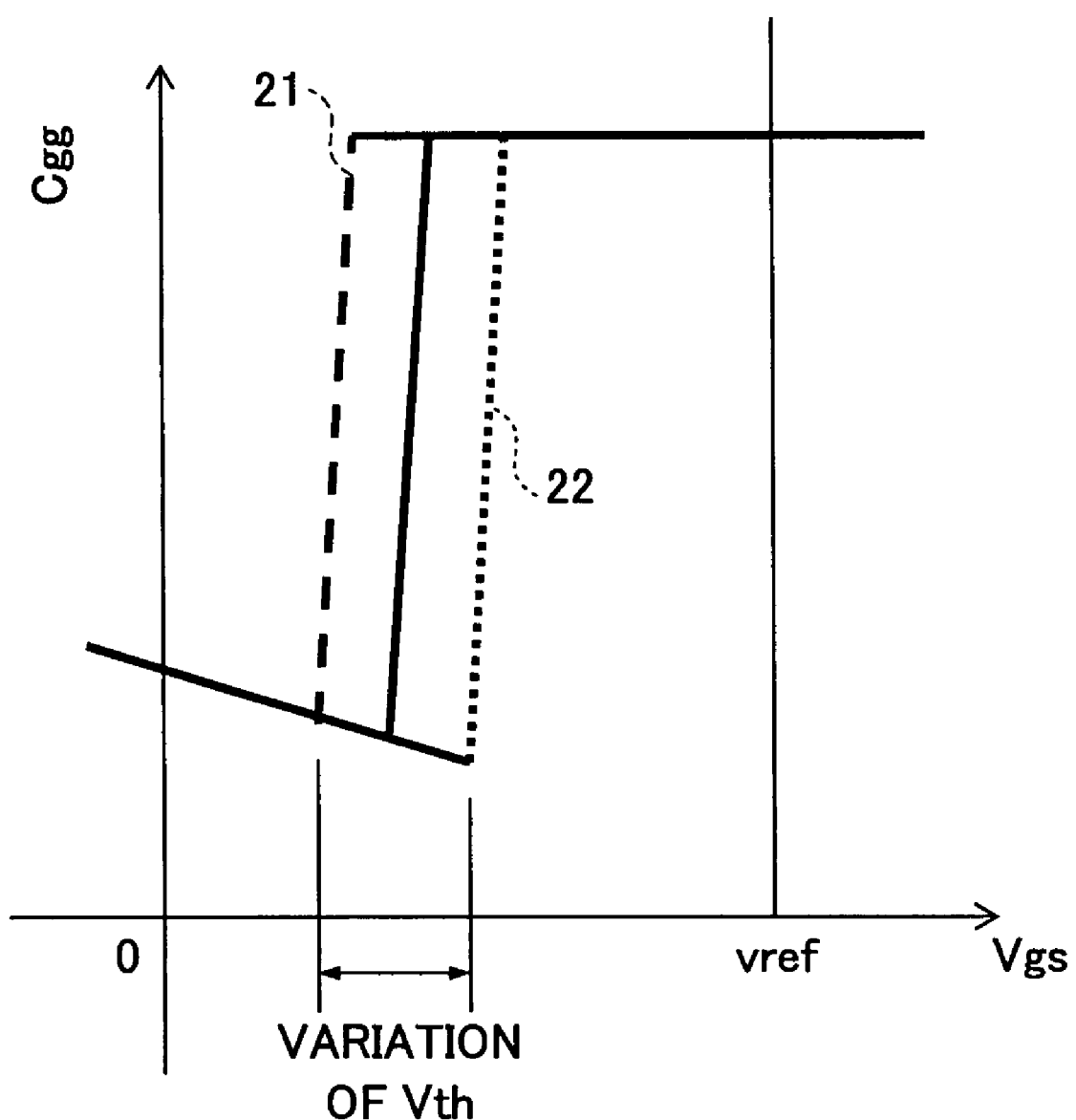
FIG. 2 is a drawing showing the capacitance characteristics of a MOS transistor when the threshold voltage of the MOS transistor exhibits variation.
Figure 3:
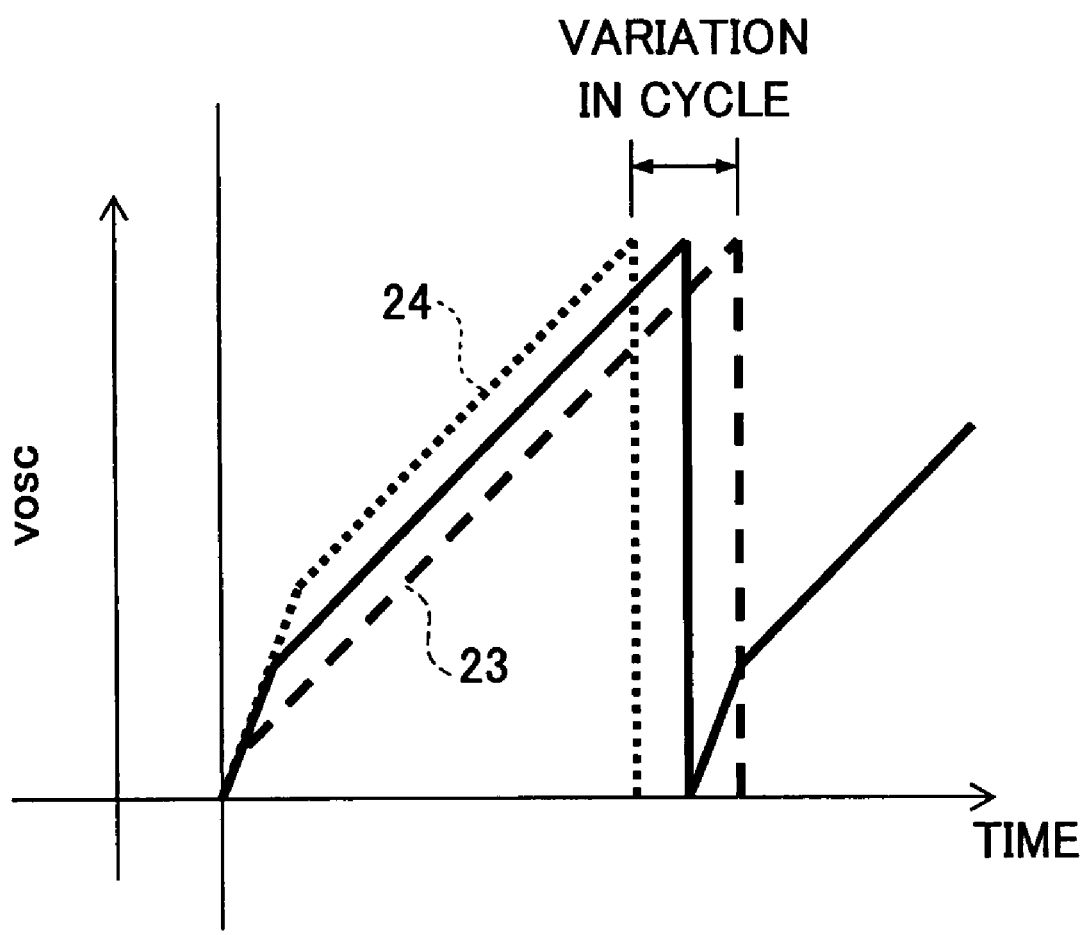
FIG. 3 is a drawing showing the voltage variation of a charge store node of a capacitor caused by the variation of a threshold voltage.

The potential vosc of the charge store node of the capacitor 35 operates in a voltage range between vrefl and vrefh (between a potential slightly lower than vrefl and a potential slightly higher than vrefh, to be exact). The cycle tOSC is thus not affected by variation in the threshold voltage Vth if the reference voltage vrefl is set higher than the threshold voltage Vth of the MOS transistor of the capacitor 35. In this manner, the present invention provides two electric current sources for charging and discharging a capacitor, and an arrangement is made such that the voltage range in which the voltage appearing across the opposite ends of the capacitor varies in response to the charging/discharging operation is positioned above the threshold voltage of the MOS transistor that constitutes the capacitor. In other words, the voltage range in which the voltage across the capacitor varies in response to the charging/discharging operation is set such as not to include the threshold voltage of the MOS transistor that constitutes the capacitor. Namely, in FIG. 2, for example, provision is made such that vrefl is positioned on the right-hand side of the threshold voltage Vth of the capacitance characteristic 22. With this provision, it is possible to generate a cyclic signal that is not affected by the variation of the threshold voltage Vth.

In the following, a second embodiment of the oscillator circuit according to the present invention will be described. Even when an oscillator circuit free from the effect of the variation of the threshold voltage Vth is constructed, the capacitance inevitably exhibits variation attributable to other causes than the threshold voltage Vth. Also, there are variations in the current source, reference voltage, comparator offsets, etc., as previously described. There is thus a need to adjust the oscillating cycle of the oscillator to a desired cycle by measuring the oscillating cycle of the oscillator by use of a tester at a testing step of a circuit (e.g., DRAM) incorporating such oscillator. Arrangement is made in advance such that an oscillating cycle is adjustable by adjusting the current amount of the current source through cutting or leaving intact fuses, for example. The fuses may then be cut as appropriate to achieve a desired cycle based on the checking of the cycle measured by the tester.

Figure 6:
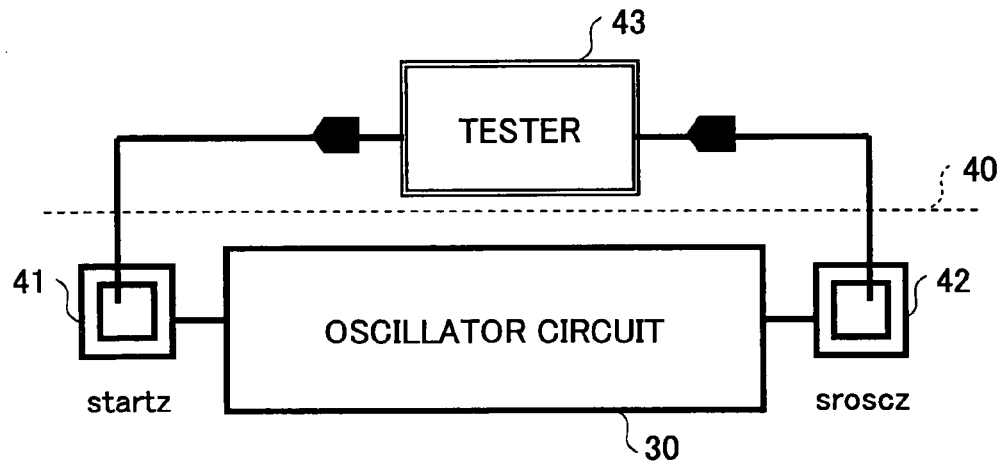
FIG. 6 is a drawing for explaining the configuration for measuring cycles by use of a tester.

FIG. 6 is a drawing for explaining the configuration for measuring cycles by use of a tester. As shown in FIG. 6, a tester 43 is connected to pads 41 and 42 of a semiconductor chip 40 that may be a semiconductor memory device including the oscillator circuit 30. The pad 41 is coupled to a node into which a startup signal startz for controlling the activation and deactivation of the oscillator circuit 30 is input, and the pad 42 is coupled to the output sroscz of the counter 37 of the oscillator circuit 30.

Figure 7:
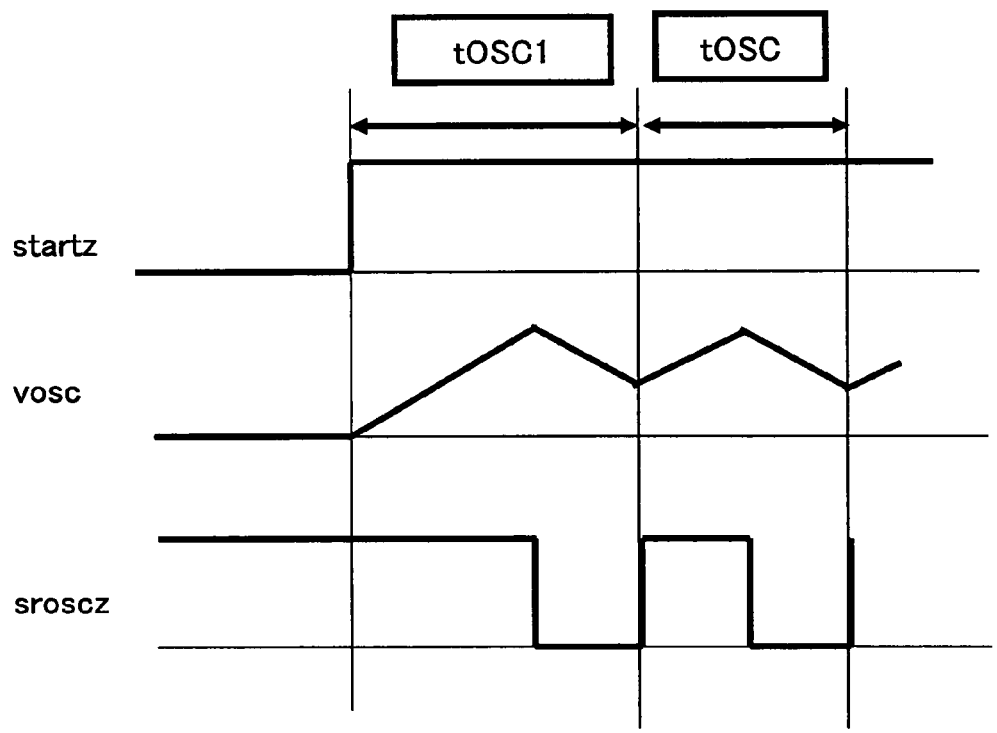
FIG. 7 is a drawing for explaining the method of measuring the cycle of the oscillator circuit by use of the tester.

FIG. 7 is a drawing for explaining the method of measuring the cycle of the oscillator circuit 30 by use of the tester 43 in the configuration shown in FIG. 6. The tester 43 first supplies to the pad 41 the startup signal startz changing from LOW to HIGH, thereby activating and starting the operation of the oscillator circuit 30 at the timing of the LOW-to-HIGH transition of startz. In the initial state, the potential vosc (i.e., the potential at the charge store node of the capacitor 35) is zero. When the oscillator circuit 30 starts its operation, the potential vosc rises to vrefh, and thereafter keeps rising and falling between vrefl and vrefh. The output sroscz appearing at the pad 42 changes as shown in FIG. 7 in accordance with the changes of the potential vosc.

The arrangement that is assumed with respect to FIG. 7 is that the potential vosc rises during HIGH of the output sroscz, and falls during LOW of the output sroscz, which is different from the configuration shown in FIG. 5 in terms of the relationships between the output sroscz and the potential vosc. This is simply a matter of definition as to which signal in the circuit of FIG. 4 is designated as sroscz. If the output of the inverter 45 is designated as sroscz, the relationships between the output sroscz and the potential vosc as shown in FIG. 7 are obtained.

As can be seen from FIG. 7, the potential vosc starts rising from zero upon the start of operation of the oscillator circuit 30, so that the first cycle tOSC1 has a different length than the cycle tOSC appearing in the subsequent steady state. The tester 43 measures the timing of a change of the output sroscz (e.g., the first rise timing) by measuring a time length between a reference point and such timing of change, wherein the timing at which the startup signal startz changes from LOW to HIGH serves as the reference point. Thus, correct cycle measurement cannot be made if the first cycle tOSC1 is different from the cycle in the steady state. It is thus preferable to have the first cycle equal to the steady state cycle tOSC in order to perform a correct cycle measurement without modifying the configuration of the tester 43 and without using complex control operations.

Figure 8:
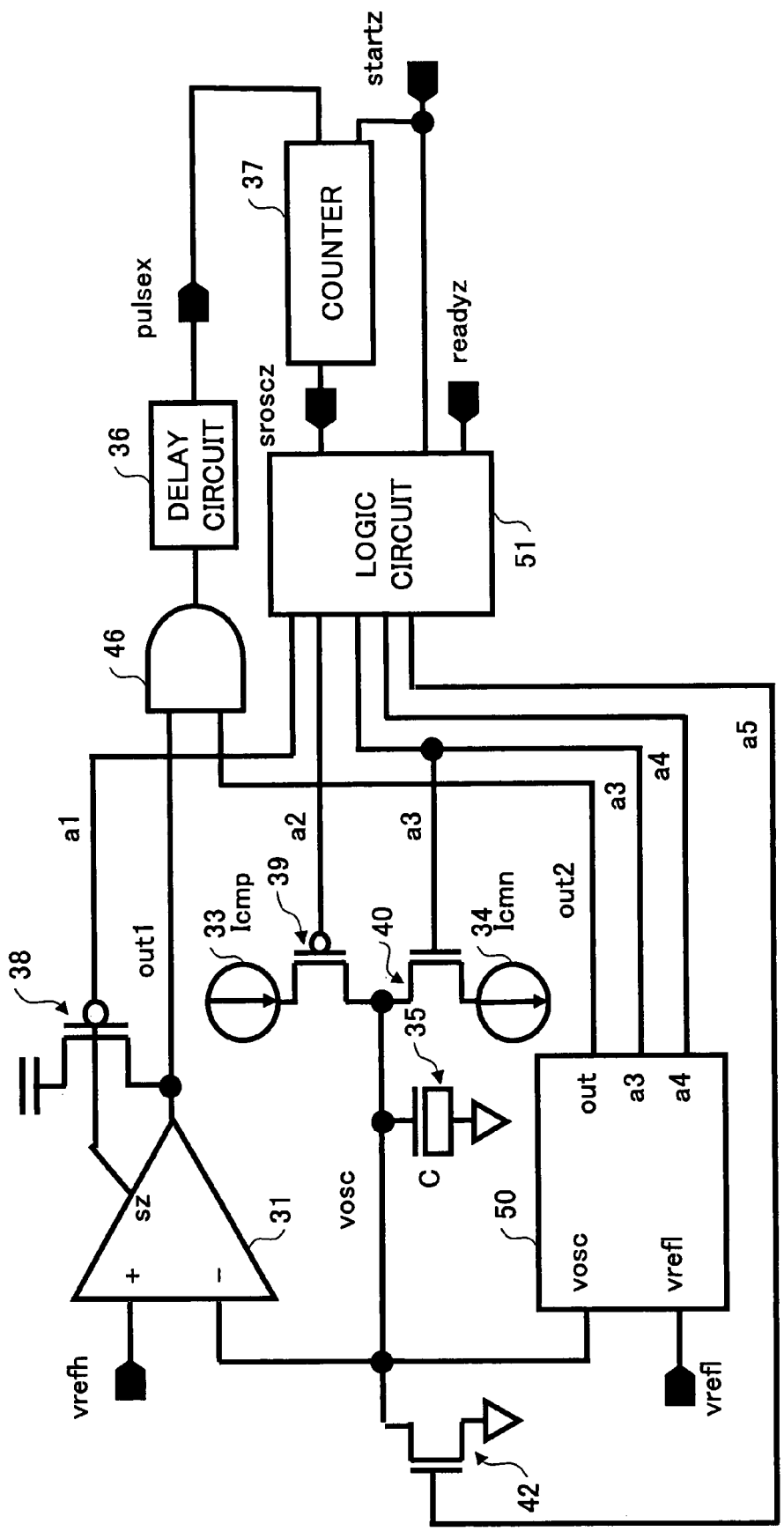
FIG. 8 is a drawing showing the circuit configuration of a second embodiment of an oscillator circuit according to the present invention.

FIG. 8 is a drawing showing the circuit configuration of a second embodiment of an oscillator circuit according to the present invention. In FIG. 8, the same elements as those of FIG. 4 are referred to by the same numerals, and a description thereof will be omitted.

An oscillator circuit 30A shown in FIG. 8 includes a comparator 31, a constant current source 33, a constant current source 34, a capacitor 35, a delay circuit 36, a counter 37, PMOS transistors 38 and 39, NMOS transistors 40 and 42, an AND gate 46, a feedback-function-equipped comparator 50, and a logic circuit 51. In comparison with the oscillator circuit 30 shown in FIG. 4, the feedback-function-equipped comparator 50 is provided in place of the comparator 32, and the logic circuit 51 is provided to replace the inverters 43 through 45. The feedback-function-equipped comparator 50 performs feedback control utilizing the comparator at the time of start of operation so as to set the potential vosc to the reference voltage vrefl. The logic circuit 51 serves to generate control signals a1 through a5 for controlling various parts.

Figure 9:
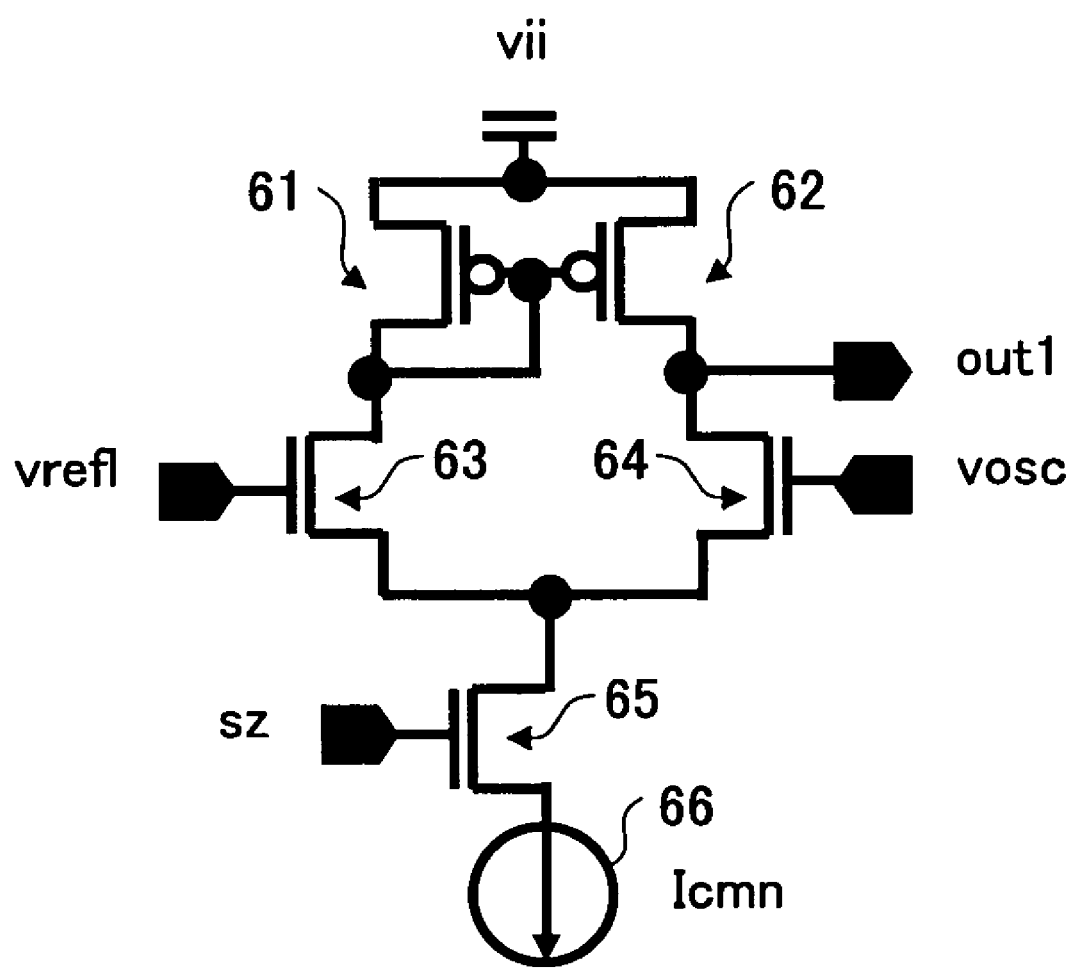
FIG. 9 is a drawing showing an example of the circuit configuration of a comparator.

FIG. 9 is a drawing showing an example of the circuit configuration of the comparator 31. As shown in FIG. 9, the comparator 31 is implemented by using a differential amplifier, and includes PMOS transistors 61 and 62, NMOS transistors 63 through 65, and a constant current source 66. The NMOS transistor 65 is turned on/off by the signal sz so as to control the activation/deactivation of the comparator 31.

Figure 10:
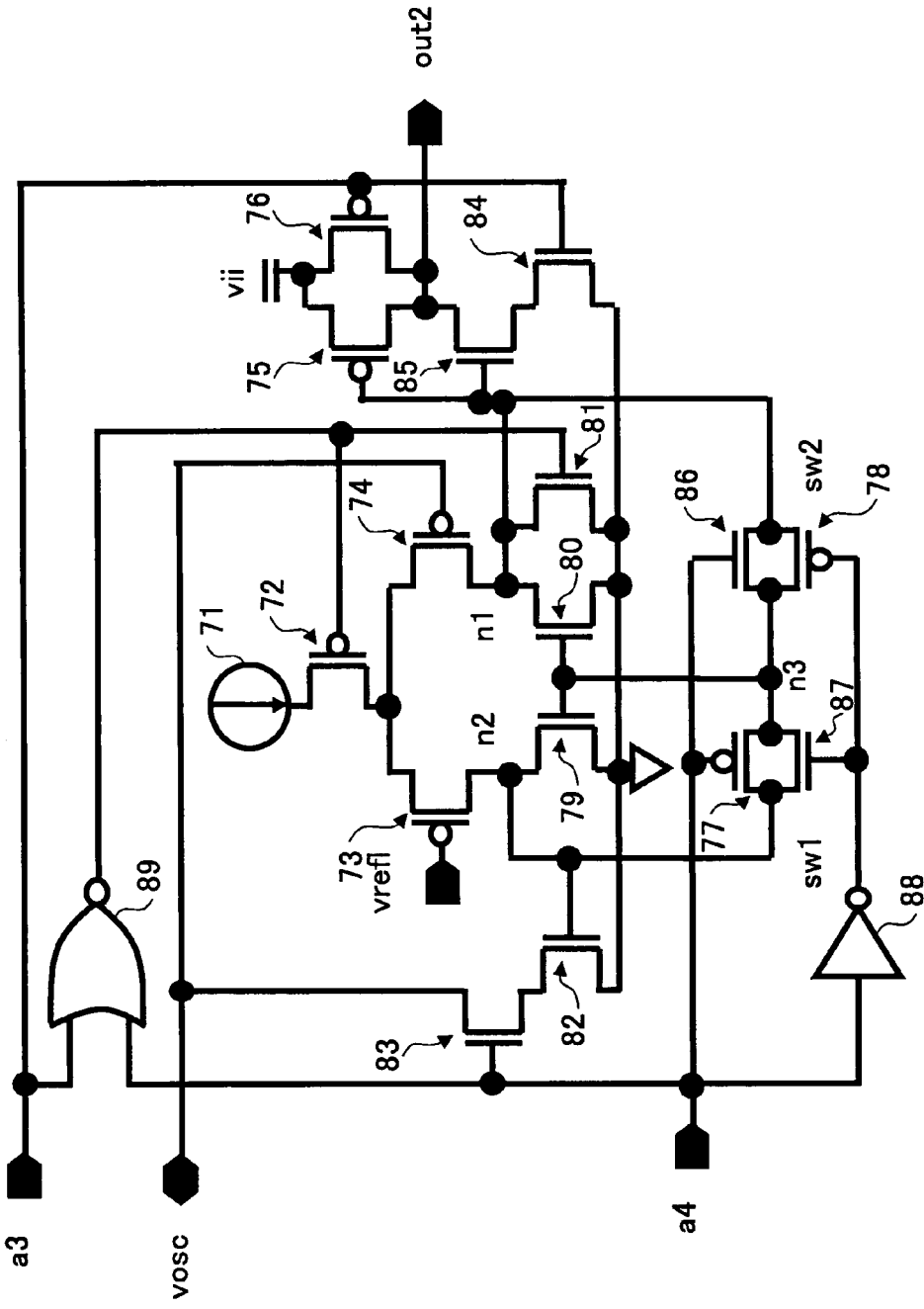
FIG. 10 is a drawing showing an example of the circuit configuration of a feedback-function-equipped comparator.

FIG. 10 is a drawing showing an example of the circuit configuration of the feedback-function-equipped comparator 50. The feedback-function-equipped comparator 50 shown in FIG. 10 serves to provide a comparison function and a feedback control function by use of a differential amplifier, and includes a constant current source 71, PMOS transistors 72 through 78, NMOS transistors 79 through 87, an inverter 88, and an NOR gate 89. The portion comprised of the constant current source 71, the PMOS transistors 72 through 74, and the NMOS transistors 79 and 80 is a differential amplifier that compares the potential vosc with the reference voltage vrefl. A path extending from the NMOS transistor 82 having the gate thereof connected to a node n2, passing through the NMOS transistor 83, and reaching the gate of the PMOS transistor 74 serves as a feedback path for setting the potential vosc.

FIG. 11 is a truth table showing the inputs/outputs of the logic circuit 51. According to this truth table, the logic circuit 51 generates the control signals a1 through a5 so as to perform the operation for setting the potential vosc to the reference voltage vrefl at the time of start of operation and the operation for raising and lowering the potential vosc at the time of steady operation.

The operation for setting the potential vosc to the reference voltage vrefl at the start of operation will be described first. In order to set the potential vosc to the reference voltage vrefl, the startup signal startz and the ready signal readyz are set to LOW and HIGH, respectively, prior to the changing of the startup signal startz to HIGH. In this state, as shown in the truth table of FIG. 11, the logic circuit 51 sets the control signals a3 and a4 to LOW and HIGH, respectively.

When the control signals a3 and a4 shown in FIG. 10 are set to LOW and HIGH, respectively, the circuit will operate as follows. Since the control signal a4 is set to HIGH, a switch sw1 comprised of the PMOS transistor 77 and the NMOS transistor 87 becomes nonconductive, and a switch sw2 comprised of the PMOS transistor 78 and the NMOS transistor 86 becomes conductive. Accordingly, a node n1 is connected to a node n3, and the node n2 functions as an output node of the differential amplifier. At this time, the reference voltage vrefl is on the inverted-input side, and the potential vosc is on the non-inverted-input side. Since the NMOS transistor 83 is conductive in this case, a feedback path is established that has the gate node of the PMOS transistor 74 serving as an input node and the node n2 serving as an output node. As the potential vosc at the input node rises, the potential at the node n2 rises due to the operation of the differential amplifier, resulting in an increase in the conductivity of the NMOS transistor 82. An increase in the conductivity of the NMOS transistor 82 serves to lower the potential vosc. Through this feedback control, the potential vosc is adjusted equal to the reference voltage vrefl. Since the control signal a3 is LOW at this time, the PMOS transistor 76 becomes conductive, thereby clamping the output out2 of the feedback-function-equipped comparator 50 to HIGH.

Through the feedback control as described above, the potential vosc is adjusted equal to the reference voltage vrefl. Accordingly, a signal having its first cycle equal to the cycle tOSC is generated when the startup signal startz is changed to HIGH to start the operation of the oscillator circuit 30A.

Figure 12:
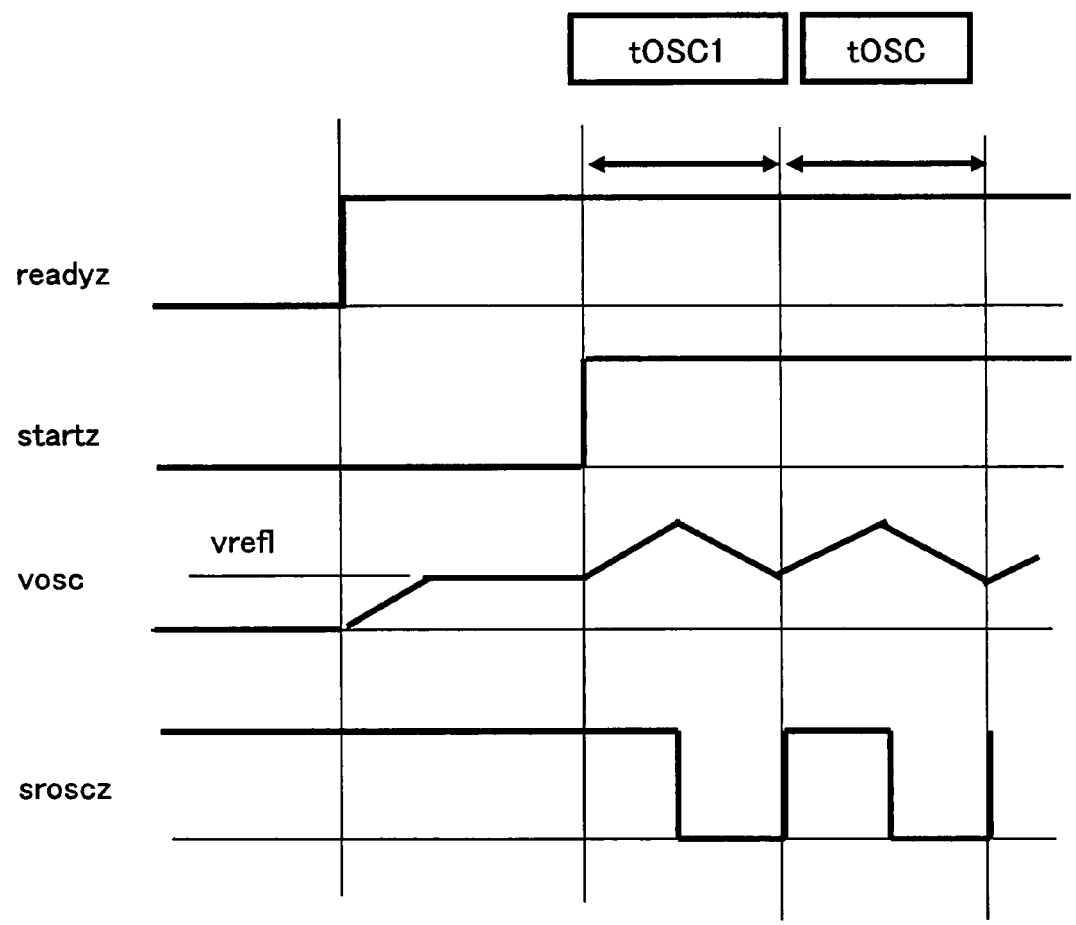
FIG. 12 is a drawing for explaining the method of measuring the cycle of the oscillator circuit of FIG. 8.

FIG. 12 is a drawing for explaining the method of measuring the cycle of the oscillator circuit 30A of FIG. 8. The tester 43 is connected to three pads of a semiconductor chip including the oscillator circuit 30A. The three pads are a pad for inputting the ready signal readyz, a pad for inputting the startup signal startz, and a pad for outputting the output signal sroscz. The tester 43 supplies the startup signal startz being LOW and the ready signal readyz being HIGH to the respective pads. In response, the oscillator circuit 30A performs the above-described feedback control, so that the potential vosc (i.e., the potential at the charge store node of the capacitor 35) rises from zero to vrefl as shown in FIG. 12.

When the startup signal startz is thereafter changed from LOW to HIGH, the oscillator circuit 30A starts oscillating, so that the potential vosc starting from its initial potential vrefl keeps rising and falling between vrefl and vrefh. The output sroscz changes as shown in FIG. 12 in accordance with the changes of the potential vosc.

As can be seen from FIG. 12, the potential vosc starts rising from vrefl upon the start of operation of the oscillator circuit 30A, so that the first cycle tOSC1 has a length equal to the cycle tOSC appearing in the subsequent steady state. The tester measures the timing of a change of the output sroscz (e.g., the first rise timing) by measuring a time length between a reference point and such timing of change, wherein the timing at which the startup signal startz changes from LOW to HIGH serves as the reference point. In the oscillator circuit 30A of the second embodiment, correct cycle measurement can be made since the first cycle tOSC1 is equal to the cycle in the steady state.

In the following, the oscillating operation of the oscillator circuit 30A after the startup signal startz is set to HIGH will be described in detail. When the startup signal startz is set to HIGH, the logic circuit 51 sets the control signal a4 to LOW as shown in the truth table of FIG. 11.

Since the control signal a4 is set to LOW in FIG. 10, the switch sw1 comprised of the PMOS transistor 77 and the NMOS transistor 87 becomes conductive, and the switch sw2 comprised of the PMOS transistor 78 and the NMOS transistor 86 becomes nonconductive. Accordingly, the node n2 is connected to the node n3, and the node n1 functions as the output node of the differential amplifier. At this time, the reference voltage vrefl is on the non-inverted-input side, and the potential vosc is on the inverted-input side. The potential at the node n1 that is the output of the differential amplifier is inverted by the PMOS transistor 75 and the NMOS transistor 85 to be output as an inverted output out2 of the comparator 50. Accordingly, the inverted output out2 of FIG. 10 becomes logically equivalent to the output of the inverter 44 that inverts out2 in the first embodiment shown in FIG. 4. The inverted output out2 of FIG. 10 becomes valid when the control signal a3 is HIGH, and is clamped to HIGH when the control signal a3 is LOW.

Referring to FIG. 8, the circuit is now assumed in a state in which the potential vosc of the charge store node of the capacitor 35 is lower than the reference voltage vrefh and higher than the reference voltage vrefl. In this state, the output out1 of the comparator 31 having its inverted input coupled to the charge store node of the capacitor 35 and its non-inverted input coupled to the reference voltage vrefh is HIGH. Further, the inverted output out2 of the comparator 50 having an inverted input thereof coupled to the charge store node of the capacitor 35 and a non-inverted input thereof coupled to the reference voltage Vrefl is HIGH. At this time, the two inputs into the AND gate 46 are both HIGH, so that an oscillator circuit pulse output pulsex is HIGH.

It is assumed that, in this state, an output sroscz of the counter 37 is LOW. Since the startup signal startz is HIGH and the counter output sroscz is LOW, the logic circuit 51 sets the control signals a2 and a3 to HIGH as shown in the truth table of FIG. 11. The PMOS transistor 39 and the NMOS transistor 40 are thus nonconductive and conductive, respectively, so that discharge occurs from the capacitor 35 to the constant current source 34. As the potential vosc of the charge store node drops below the reference voltage Vrefl in response to a decrease in the electric charge of the capacitor 35, the inverted output out2 of the comparator 50 changes from HIGH to LOW. As a result, the output of the AND gate 46 changes from HIGH to LOW, and, thereafter, the oscillator output pulsex changes from HIGH to LOW after the passage of a delay time introduced by the delay circuit 36.

In response, the output sroscz of the counter 37 is changed to HIGH. As shown in the truth table of FIG. 11, the control signal a1 changes from LOW to HIGH, so that a transition occurs from a state in which the output out1 of the comparator 31 is clamped to HIGH to a state in which it is not clamped. Further, the control signal a3 changes from HIGH to LOW, so that a transition occurs from a state in which the inverted output out2 of the comparator 50 is not clamped to a state in which it is clamped to HIGH. In response, the output of the AND gate 46 returns from LOW to HIGH. At this time, the output sroscz of the counter 37 exhibits no change and stays at HIGH.

Since the output sroscz of the counter 37 is HIGH, the logic circuit 51 sets the control signals a2 and a3 to LOW as shown in the truth table of FIG. 11. The PMOS transistor 39 and the NMOS transistor 40 are thus conductive and nonconductive, respectively, so that charge from the constant current source 33 to the capacitor 35 occurs. As the potential vosc of the charge store node rises above the reference voltage Vrefh in response to an increase in the electric charge of the capacitor 35, the output out1 of the comparator 31 changes from HIGH to LOW. As a result, the output of the AND gate 46 changes from HIGH to LOW, and, thereafter, the oscillator output pulsex changes from HIGH to LOW after the passage of a delay time introduced by the delay circuit 36.

In response, the output sroscz of the counter 37 is changed to LOW. As shown in the truth table of FIG. 11, the control signal a1 changes from HIGH to LOW, so that a transition occurs from the state in which the output out1 of the comparator 31 is not clamped to the state in which it is clamped to HIGH. Further, the control signal a3 changes from LOW to HIGH, so that a transition occurs from the state in which the inverted output out2 of the comparator 50 is clamped to HIGH to the state in which it is not clamped. In response, the output of the AND gate 46 returns from LOW to HIGH. At this time, the output sroscz of the counter 37 exhibits no change and stays at LOW.

The operation of the comparator 31 is suspended by setting an activation signal sz to LOW during when the output out1 of the comparator 31 is clamped to HIGH. During the period in which the inverted output out2 is clamped to HIGH, the operation of the comparator 50 is suspended by the nonconductive state of the PMOS transistor 72 occurring in response to the HIGH output of the NOR gate 89 since the control signals a3 and a4 are both LOW.

The operation described above is repeated so that the potential vosc of the charge store node of the capacitor 35 repeatedly rises and falls between vrefl and vrefh, thereby generating a pulse signal output pulsex corresponding to such repeating operation. A cycle tOSC of this pulse is theoretically C·(vrefh−vrefl)·(1/Icmn+1/Icmp).

The potential vosc of the charge store node of the capacitor 35 operates in a voltage range between vrefl and vrefh (between a potential slightly lower than vrefl and a potential slightly higher than vrefh, to be exact). The cycle tOSC is thus not affected by variation in the threshold voltage Vth if the reference voltage Vrefl is set higher than the threshold voltage Vth of the MOS transistor of the capacitor 35.

In the first and second embodiments described above, NMOS or PMOS transistors having a predetermined bias voltage applied to their gate node may be used as the current sources (i.e., the constant current sources 33, 34, 66, 71, and so on). Further, the delay circuit 36 may be implemented as a circuit made by connecting inverters and capacitors alternately.

Figure 13:
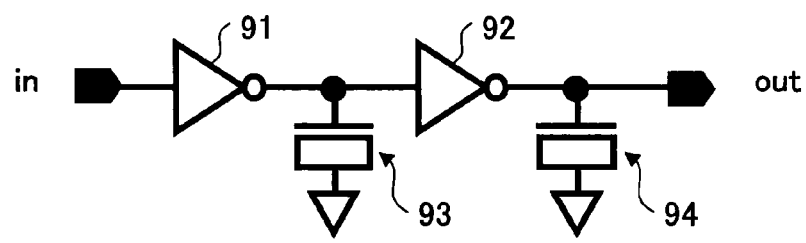
FIG. 13 is a drawing showing an example of the circuit configuration of a delay circuit.

FIG. 13 is a drawing showing an example of the circuit configuration of the delay circuit 36. The delay circuit 36 of FIG. 13 includes inverters 91 and 92 and capacitors 93 and 94. Outputs of the inverters 91 and 92 are connected to the capacitors 93 and 94, respectively. The capacitances of the capacitors and the drive powers (output current amounts) of the inverters are adjusted as appropriate, thereby providing a delay circuit having a desired delay time.

Figure 14:
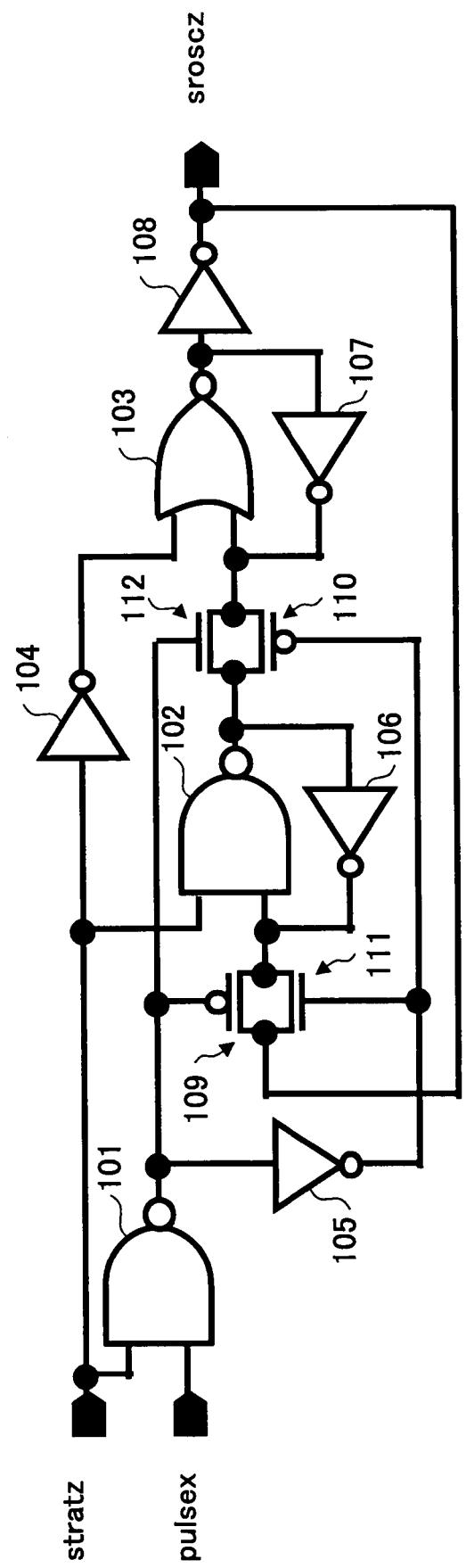
FIG. 14 is a drawing showing an example of the circuit configuration of the counter.

FIG. 14 is a drawing showing an example of the circuit configuration of the counter 37. The counter shown in FIG. 14 is a frequency divider circuit for performing a frequency division with respect to a pulse signal, and includes NAND gates 101 and 102, a NOR gate 103, inverters 104 through 108, PMOS transistors 109 and 110, and NMOS transistors 111 and 112.

When the startup signal startz is LOW, the output of the NOR gate 103 is fixed to LOW, so that the output sroscz is fixed to HIGH. When the startup signal startz is HIGH, the NAND gates 101 and 102 as well as the NOR gate 103 each serve as an inverter. The NAND gate 101 and the inverter 106 constitute a first latch, and the NOR gate 103 and the inverter 107 constitute a second latch. The PMOS transistor 109 and the NMOS transistor 111 together constitute a first transfer gate, and the PMOS transistor 110 and the NMOS transistor 112 together make up a second transfer gate.

It is assumed that the output sroscz is HIGH in the initial state. The first transfer gate is in the open state so that the HIGH level of the output sroscz is stored in the first latch when the startup signal startz is HIGH and the pulse signal pulsex is HIGH. In this state, the second transfer gate is in the closed state.

The second transfer gate opens when the pulse signal pulsex is changed to LOW while the startup signal startz is HIGH, thereby causing the LOW output of the first latch storing HIGH to be stored in the second latch. As the second latch stores LOW, a LOW output is produced as the output sroscz.

As the pulse signal pulsex returns to HIGH, the first transfer gate is placed in the open state, so that the LOW level of the output sroscz is stored in the first latch. In this state, the second transfer gate is in the closed state.

The second transfer gate thereafter opens when the pulse signal pulsex is changed to LOW, thereby causing the HIGH output of the first latch storing LOW to be stored in the second latch. As the second latch stores HIGH, a HIGH output is produced as the output sroscz.

In this manner, the output sroscz changes from HIGH to LOW or from LOW to HIGH each time the pulse signal pulsex becomes LOW. With this provision, the counter output sroscz responsive to the pulse signal pulsex as shown in FIG. 5 can be generated.

Further, the present invention is not limited to these embodiments, but various variations and modifications may be made without departing from the scope of the present invention.

What is claimed is:

1. An oscillator circuit, comprising:
   a capacitor;
   a first constant current source electrically couplable to an end of the capacitor;
   a second constant current source electrically couplable to the end of the capacitor;
   a control circuit coupled to the end of the capacitor, a first reference potential, and a second reference potential to switch, in response to a comparison of a potential at the end of the capacitor with the first and second reference potentials, between a first operation to charge the capacitor by electrically coupling the first constant current source to the end of the capacitor and a second operation to discharge the capacitor by electrically coupling the second constant current source to the end of the capacitor; and
   a circuit configured to have an output signal thereof exhibiting a signal transition in response to timing at which the switching occurs between the first operation and the second operation.

2. The oscillator circuit as claimed in claim 1, wherein the capacitor is a MOS transistor.

3. The oscillator circuit as claimed in claim 2, wherein the first and second reference potentials are such that a threshold voltage of the MOS transistor is not situated between the first and second reference potentials.

4. The oscillator circuit as claimed in claim 1, wherein the control circuit is configured to switch from the first operation to the second operation in response to a comparison of the potential at the end of the capacitor with the first reference potential and to switch from the second operation to the first operation in response to a comparison of the potential at the end of the capacitor with the second reference potential.

5. The oscillator circuit as claimed in claim 4, wherein the control circuit includes:
   a first comparator configured to compare the potential at the end of the capacitor with the first reference potential;
   a second comparator configured to compare the potential at the end of the capacitor with the second reference potential;
   a first switch configured to couple the end of the capacitor to the first constant current source;
   a second switch configured to couple the end of the capacitor to the second constant current source; and a logic circuit configured to control opening/closing of the first and second switches in response to outputs of the first and second comparators.

6. The oscillator circuit as claimed in claim 5, wherein the logic circuit is configured to control the first and second comparators such that the first comparator and the second comparator are placed in an active state and in an inactive state, respectively, in the first operation, and such that the first comparator and the second comparator are placed in an inactive state and in an active state, respectively, in the second operation.

7. The oscillator circuit as claimed in claim 4, wherein the control circuit is configured to receive a predetermined signal from an external source and to start the first operation and the second operation in response to a change of the predetermined signal to an asserted state, and is configured to be capable of setting a potential at the end of the capacitor equal to the second reference potential in a state in which neither the first operation nor the second operation is being performed.

8. The oscillator circuit as claimed in claim 7, wherein the control circuit includes:
a first comparator having input nodes thereof coupled to the end of the capacitor and to the first reference potential;
a second comparator having input nodes thereof coupled to the end of the capacitor and to the second reference potential;
a first switch configured to couple the end of the capacitor to the first constant current source;
a second switch configured to couple the end of the capacitor to the second constant current source;
a logic circuit configured to control opening/closing of the first and second switches in response to outputs of the first and second comparators; and
a feedback path configured to adjust a potential at the end of the capacitor coupled to one of the input nodes of the second comparator in response to an output of the second comparator.

9. The oscillator circuit as claimed in claim 8, wherein the input nodes of the second comparator are a first input node and a second input node, and the second comparator is configured to be capable of switching between a first state in which the first input node and the second input node serve as an inverted input node and a non-inverted input node, respectively, and a second state in which the first input node and the second input node serve as a non-inverted input node and an inverted input node, respectively.

10. A semiconductor memory device, comprising an oscillator circuit of claim 1.

* * * * *